(12) United States Patent
Woodhead et al.

(10) Patent No.: US 8,350,580 B2
(45) Date of Patent: Jan. 8, 2013

(54) TIME DOMAIN REFLECTOMETRY SYSTEM AND METHOD OF USE

(75) Inventors: Ian Maxwell Woodhead, Christchurch (NZ); Ian Gregory Platt, Christchurch (NZ)

(73) Assignee: Lincoln Ventures Limited (NZ)

( * ) Notice: Subject to any disclaimer, the term of this patent is extended or adjusted under 35 U.S.C. 154(b) by 373 days.

(21) Appl. No.: 12/676,853

(22) PCT Filed: Sep. 8, 2008

(86) PCT No.: PCT/NZ2008/000229
§ 371 (c)(1),
(2), (4) Date: Jul. 6, 2010

(87) PCT Pub. No.: WO2009/031909
PCT Pub. Date: Mar. 12, 2009

(65) Prior Publication Data
US 2010/0289502 A1    Nov. 18, 2010

(30) Foreign Application Priority Data

Sep. 7, 2007    (NZ) ........................................ 561300

(51) Int. Cl.
*G01R 27/28*         (2006.01)
(52) U.S. Cl. ................... 324/649; 324/643; 324/754.07; 324/639; 73/803; 73/865
(58) Field of Classification Search .................... 324/649
See application file for complete search history.

(56) References Cited

U.S. PATENT DOCUMENTS

| | | | | |
|---|---|---|---|---|
| 5,136,249 A | * | 8/1992 | White et al. .................. | 324/643 |
| 5,726,578 A | * | 3/1998 | Hook ............................. | 324/643 |
| 6,104,200 A | * | 8/2000 | Hook ............................. | 324/643 |
| 6,215,317 B1 | * | 4/2001 | Siddiqui et al. ............... | 324/643 |
| 6,986,294 B2 | * | 1/2006 | Fromme et al. ............... | 73/865.8 |
| 7,262,607 B2 | * | 8/2007 | Champion et al. ............ | 324/639 |
| 2002/0075009 A1 | * | 6/2002 | Butler ............................ | 324/534 |
| 2003/0079365 A1 | * | 5/2003 | Corak et al. ................... | 34/89 |
| 2004/0031335 A1 | * | 2/2004 | Fromme et al. ............... | 73/865 |
| 2005/0210995 A1 | * | 9/2005 | Drnevich et al. .............. | 73/803 |
| 2006/0267604 A1 | * | 11/2006 | Yang ............................... | 324/754 |
| 2007/0159195 A1 | * | 7/2007 | Yang et al. ..................... | 324/754 |
| 2007/0273390 A1 | * | 11/2007 | Champion et al. ............ | 324/639 |
| 2008/0074122 A1 | * | 3/2008 | Barsumian et al. ........... | 324/612 |

OTHER PUBLICATIONS

Robinson et al., "A Review of Advances in Dielectric and Electrical Conductivity Measurements in Soils Using Time Domain Reflectometry." Vadose Zone J:, vol. 2, pp. 444-475, Nov. 2003.

(Continued)

*Primary Examiner* — Timothy J Dole
*Assistant Examiner* — Benjamin M Baldridge
(74) *Attorney, Agent, or Firm* — Ice Miller LLP

(57) ABSTRACT

A non-invasive Time Domain Reflectometry transmission line system and method for measuring one or more parameters of an electromagnetic Radio Frequency pulse transmitted, and reflected, along a transmission line, the parameters including at least one of; amplitude, propagation velocity and/or propagation time between defined predetermined instances. The system includes a transmission line structure including three or more elongated transmission elements each having two distal ends. Each element is capable of being selectively activated in at least two distinct pairs having distinct geometric configurations relative to each other to generate at least two distinct electric field potentials without physical displacement of the transmission line.

20 Claims, 5 Drawing Sheets

OTHER PUBLICATIONS

Woodhead et al., "Non-Invasive Probing of the Near Surface Soil Moisture Profile." Fifth International Conference on Electromagnetic Wave Interaction With Water and Moist Substances, pp. 258-260, 2003.

Bassey at al., "Planar Transmission Lines for Soil Water Measurements." Antennas and Propagation Society International Symposium, 9-15, pp. 4268-4271, Jun. 2007.

Woodhead et al., "TDR Modelling for Near-Surface Moisture Profile Measurements." Proc. TDR 2006, Purdue University, West Lafayette, USA, Sep. 2006, Paper 10 44.

International Searching Authority, International Search Report, PCT/NZ2008/000229, dated Nov. 12, 2008.

International Searching Authority, Written Opinion, PCT/NZ2008/000229, dated Nov. 12, 2008.

* cited by examiner

Figure 3 – Prior Art
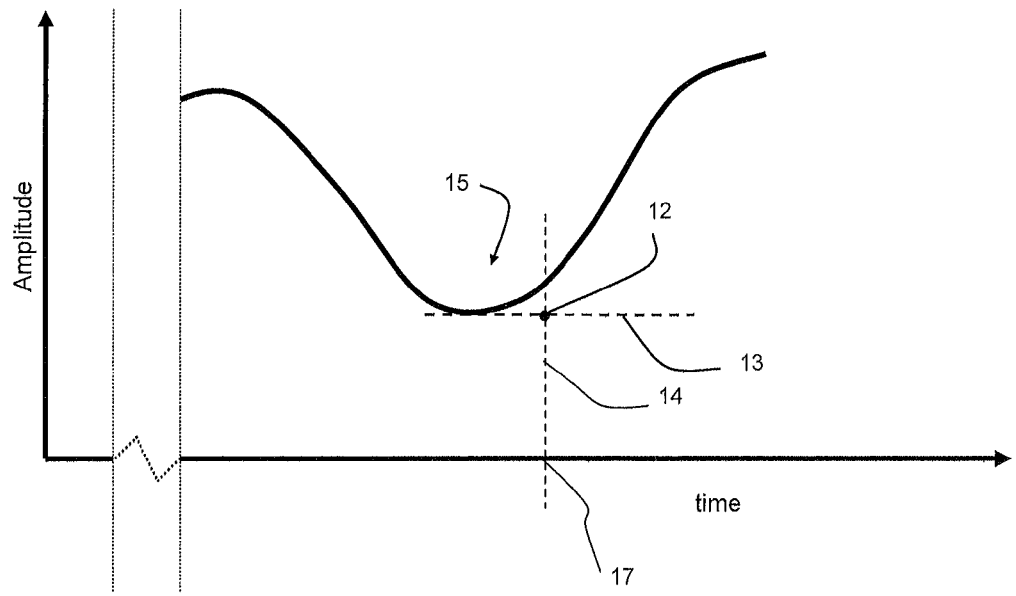
Figure 4
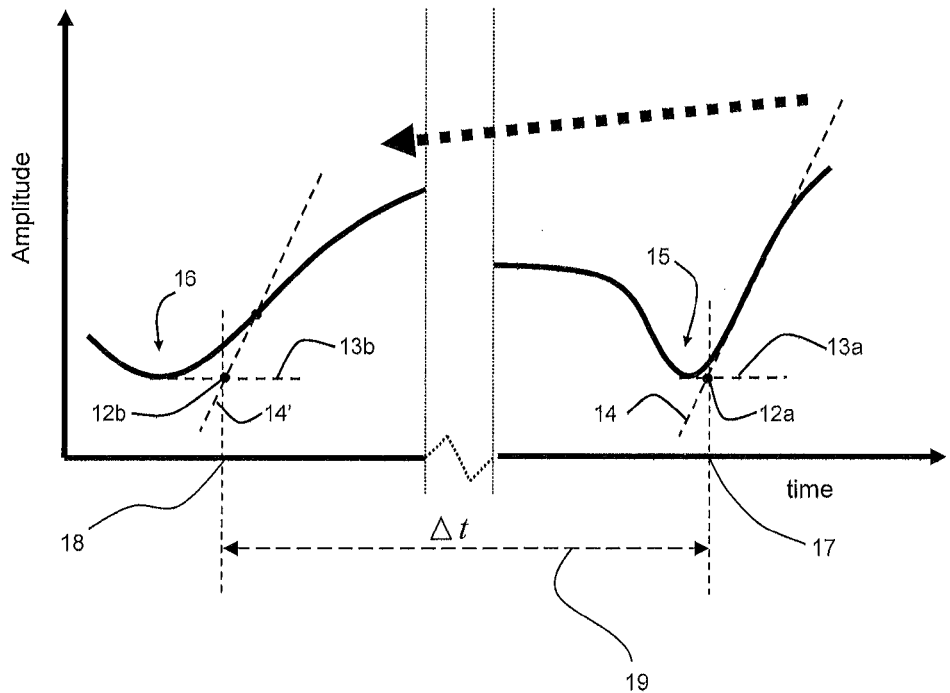

TIME DOMAIN REFLECTOMETRY SYSTEM AND METHOD OF USE

TECHNICAL FIELD

The present invention relates generally to a non-invasive time domain reflectometry (TDR) system and method of use.

STATEMENT OF CORRESPONDING APPLICATIONS AND PRIORITY

The present application is related to, claims the priority benefit of, and is a U.S. national stage application of, International Patent Application Serial No. PCT/NZ2008/000229, filed Sep. 8, 2008, which is related to, and claims the priority benefit of, New Zealand Patent Application Serial No. 561300, filed Sep. 7, 2007. The contents of each of these applications are hereby incorporated by reference in their entirety into this disclosure.

BACKGROUND ART

Time Domain Reflectometry (TDR) is an established method for determining the propagation velocity of Radio Frequency (RF) pulses along transmission lines, or probes that are typically inserted into the target material undergoing testing, to calculate water or other liquid content, determine content/volume levels in a container, or to determine material dielectric constants.

As is well known to those skilled in the art, TDR apparatus and methods have been widely used in a wide range of applications measuring water/liquid content based upon the principle that the dielectric constant (K) (i.e. the measure of relative permittivity) of water is approximately 76.9 at 23° C. while the dielectric constants for numerous other known materials are considerably lower. Utilising this disparity in permittivity provides an excellent means of measuring a material's water-content or other dielectric characteristic. The apparent dielectric constant of a moist material sample is a function of the propagation velocity of an electromagnetic wave as it transits an RF transmission line. Accurate detection of the instant the pulse starts travelling along the transmission line and the point of reflection of the pulse from the terminal end of the transmission line allows determination of the propagation velocity, and thus permittivity, of the surrounding material.

A characteristic amplitude discontinuity of the RF signal is generated at both the initiation of the pulse exiting the transmission line mounting and the point of reflection of the pulse at the end of the transmission line. However, due to the very short transit time (approximately 1 nanosecond) of the pulse between the start point of a typical 30 cm length of the transmission rod and the reflection point and the need for high accuracy levels to provide meaningful results, the issue of precisely determining both these instances is in itself a key parameter in the TDR systems' effectiveness and the subject of ongoing research.

Known TDR systems are often used invasively i.e. typically two conductive probes forming a waveguide are inserted into the target material to perform the moisture measurements. However, this has clear drawbacks in terms of operability and practicality. Consequently, non-invasive TDR systems have been used to avoid damaging the target material and to facilitate improved measurement cycle times. Non-invasive TDR systems also enable the transmission rods to be moved to different separations from the target material surface, thus generating different RF field geometries. The variation in geometries enables the deduction of moisture measurements relating to different sub-surface materials of differing dielectric constants. However, such movement needs to be precisely performed to avoid debilitating error in the target material moisture calculations. In practice, such movements of the transmission line have an attendant impact on the speed of measurements and the resulting accuracy.

All references, including any patents or patent applications cited in this specification are hereby incorporated by reference. No admission is made that any reference constitutes prior art. The discussion of the references states what their authors assert, and the applicants reserve the right to challenge the accuracy and pertinency of the cited documents. It will be clearly understood that, although a number of prior art publications are referred to herein; this reference does not constitute an admission that any of these documents form part of the common general knowledge in the art, in New Zealand or in any other country.

It is acknowledged that the term 'comprise' may, under varying jurisdictions, be to attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

It is an object of the present invention to address the foregoing problems or at least to provide the public with a useful choice.

Further aspects and advantages of the present invention will become apparent from the ensuing description, which is given by way of example only.

DISCLOSURE OF INVENTION

According to a first aspect of the present invention there is provided a non-invasive Time Domain Reflectometry (TDR) transmission line system for measuring one or more parameters of an electromagnetic Radio Frequency (RF) pulse transmitted, and reflected, along a transmission line, said parameters including at least one of; amplitude, propagation velocity and/or propagation time between defined predetermined instances, said system including:
  a transmission line, including three or more elongated transmission elements, each having two distal ends, each element being capable of being selectively activated to transmit said RF pulse;
  a mounting assembly, mounting each said transmission element at a first said distal end to form a spatially-separated transmission element array with the other 'second' distal end of each transmission element being spaced from said mounting assembly;
  an RF source configured to transmit an RF pulse along said transmission line to activate a selected pair of said transmission elements to generate an electric field between the transmission elements of said pair;
characterised in that said transmission elements are capable of selective activation of at least two distinct pairs having distinct geometric configurations relative to each other to generate at least two distinct electric field potentials without physical displacement of the transmission line.

According to a further aspect of the present invention there is provided a method of non-invasive measurement of electrical permittivity of a target material using a TDR transmission line system substantially as hereinbefore described, the method including determining the propagation time of an electromagnetic RF pulse transmitted along a said pair of transmission elements between defined predetermined points of the transmission line.

According to a further aspect of the present invention there is provided a method of non-invasive measurement of electrical permittivity, $\in_n$ of n target materials by determining one or more parameters of an electromagnetic RF pulse transmitted by a Time Domain Reflectometry (TDR) transmission line system spatially displaced from said target material, said parameters including amplitude and at least one of, propagation velocity and/or propagation time between defined predetermined points of the transmission line, said system including:

- a transmission line, including three or more elongated transmission elements, each having two distal ends, each element capable of being selectively activated to transmit said RF pulse;
- a mounting assembly, mounting each said transmission element at a 'first' said distal end to form a spatially-separated transmission element array with the other 'second' distal end of each transmission element being spaced from said mounting assembly;
- an RF source configured to transmit an RF pulse along said transmission line to activate a selected pair of said transmission elements to generate an electric field between the transmission elements of said pair;

said method characterised by the steps of:
- activating a first pair of said transmission elements to transmit a first RF pulse;
- b) measuring at least one pair of said first RF pulse parameters;
- c) activating a second distinct pair of said transmission elements to transmit a second RF pulse;
- d) measuring at least one pair of said second RF pulse parameters;
- e) activating an $n^{th}$ distinct pair of said transmission elements to transmit an $n^{th}$ RF pulse
- f) measuring at least one pair of said $n^{th}$ RF pulse parameters;
- g) repeating steps d)-e) n times for n target materials; and then
- h) using the n pairs of measurements to calculate the electrical permittivity, $\in_1$ to $\in_n$ of the n target materials.

Each distinct pair of transmission elements provides a distinct electric field as the spacing between the transmission elements of that pair is different to that of the other pairs. These distinct electric fields provide a way to penetrate the target materials at different depths to identify the permittivity stratification and therefore also the moisture content stratification.

Thus, the present invention provides a means of rapidly generating a plurality of different imposed electric field potentials emanating from each activated pair of transmission elements without need to physically displace a single pair of elements to different separations from the target materials.

As used herein, the free portion of each transmission element not attached, mounted, encased or otherwise in contact with the mounting assembly is referred to as the "active portion" of the element. The other transmission element portion attached, mounted, encased or otherwise in contact with the mounting assembly is referred to as the "head" of that transmission element.

Preferably, substantially identical RF pulses are transmitted along each distinct pair of transmission elements.

Preferably, said system further includes a controller, capable of selectively activating a said pair of transmission elements. The controller may activate the transmission elements in a variety of known means including electrical, physical and/or computer software switching systems.

According to a further aspect, the transmission element array is configured with at least two non-identical physical separations between pairs of transmission elements.

Preferably, the transmission elements are parallel rods, though it will be understood alternative configurations are feasible. Judicious selection of the mutual separation between transmission rods increases the number of unique separations present amongst all the permutations of any given number of transmission elements.

In a further embodiment the separation of the rods may be variable to provide for altering the transmission and measurement characteristics of the material.

The velocity of an RF pulse along a rod in an environment adjacent to one or more target materials is proportional to the electrical permittivity of the target materials. Thus, the permittivity may be calculated from knowledge of the length and compositional material of the transmission rods. Consequently, accurate timing of the reflected RF pulse is a cornerstone parameter measurement to measure the permittivity $\in_n$ of the material and consequently, other related target material properties such as moisture content.

Each transmitted RF pulse generates an electric field which causes a polarization within the dielectric component of each target material, which in turn effects the pulse propagation time. Measurement of the pulse propagation time is determined between two defined predetermined instances (as discussed further below) and provide basis for an equation for the interaction between the generated static electric field and a target material. As each pair of activated transmission elements is selected to generate a unique geometric interaction between the electric field and a target material, each activated pair of transmission lines results in one equation. Thus the electrical permittivity of n number of different target materials may be determined by n simultaneous equations derived from pulse parameter measurements from n unique imposed electric field geometries.

As these different electric field geometries emanating from activation of successive transmission element pairs are implemented without physical movement of the transmission element array, it provides the advantages of:
- facilitating rapid measurements,
- being more robust and conducive to efficient and reliable packaging, and
- minimising inherent and/or inadvertent user inaccuracies stemming from any positional tolerance characteristic of the placement means used to position the array at different separations from the target materials.

It will be appreciated that although several characteristic properties of the individual transmission elements may be varied to provide a different resultant electrical field when selected for activation as part of a pair, it is expeditious to restrict the variation to a single property, preferably being the lateral separation of parallel transmission rods. To aid clarity and avoid prolixity, the present invention will be primarily described herein with reference to such a configuration and application, though it will be understood the present invention is not limited to same.

As the propagation velocity of electromagnetic radiation is extremely high and, commensurately, the propagation time of the reflected pulse over the length of the transmission rod is typically in the order of nanoseconds (around $1 \times 10^{-9}$ for a typical line length of 30 cm), timing measurement accuracy is critical (requiring accuracies of the order of 1 picoseconds). Several known techniques have been employed to enable discernment of definable, repeatable predetermined instances as reference points for measuring the pulse transit time in TDR systems.

For example, a first "instance" may include the point/time when a pulse transmitted along a transmission element exits the corresponding mounting assembly, i.e. at the interface between the head and active portion. At this 'transition' point there is a characteristic change in the signal amplitude due to the change in the permittivity of the surrounding medium, e.g. from mounting assembly to air. Similarly, a second "instance" may be when the pulse is reflected from the second end of the transmission element where a similar amplitude discontinuity is generated. Both events have been used to define a start/stop "instance" for transit time measurements. However, difficulties remain with the accuracy and consistency of the prior art techniques.

One known technique for determining the pulse transition point from a mounting assembly to the reflection point is through analysis of a graphical plot of pulse signal amplitude/time. The transition point in time is identified as the intersection between:
 a) a horizontal line tangential to the minimum signal amplitude, and
 b) a second line tangential to the point of maximum gradient adjacent (along the time axis) the nearest preceding minima, To improve the accuracy of such prior art so that the 1 picosecond calibration tolerance can be obtained more robustly the present invention uses the following alternative calibration means.

According to a further aspect of said method of non-invasive measurement of electrical permittivity, there is provided the step of determining the parameters of propagation time between defined predetermined points for a signal-amplitude vs. time graphical representation, wherein;
 a start and stop point respectively denoting the transmitted pulse's transition from an interface between the head to the active portion of the transmission element and reflection from the transmission element second end are defined by steps including:
  i. identifying a first unambiguous amplitude minima proximal the pulse transition from said head to said active portion of the transmission element and a second minima proximal the pulse reflection from the second end of said transmission element;
  ii. determining the maximum gradient adjacent said first and second minima;
  iii. calculating for each said minima, an intersection point between a tangent to a first said maximum gradient and a constant amplitude value extrapolation of the corresponding minima;
  iv. translating said first tangent to the other second maximum gradient;
  v. determining an intersection point between the translation of said first tangent to the other second maximum gradient and a constant amplitude value extrapolation of the corresponding minima;
  vi. defining said intersections as said predetermined start and stop points for calculating the pulse propagation time.

Thus, the maximum gradient (which is also typically the point of inflection) corresponding to one minima is extrapolated to the other minima and, in conjunction with the intersections of each maximum gradient line with a constant value amplitude extrapolated from each corresponding minimum value, is used to define the start/stop points of the transmitted pulse. It has been found that this technique provides a far more accurate determination of the start/stop points in relation to calculating the pulse transition time.

Preferably, the first maximum gradient is the maximum gradient adjacent said second minima. Thus, the gradient used to determine the stop point is also translated to be used as the gradient to determine the start point.

While the above technique may be used to identify the stop point associated with the pulse reflection and the start point or vice versa, the accuracy of this technique in identifying the stop and start points may vary with changes in measuring equipment or the RF pulse used. Thus, a second calibration technique, as described below, may be advantageously used in conjunction with the above calibration method.

The present invention provides an improvement in accuracy over prior art techniques by the use of a second inventive calibration technique using an apparatus provided in the form of a pair of transmission stubs physically located in the same mounting assembly as the transmission elements and constructed from the same material as the transmission elements. The stubs have a first and second distal ends and are orientated such that their second end is located at the same point relative to the mounting assembly as the interface/transition-point between the head and active portions of the transmission elements. The stubs are configured to carry the same propagation signal (i.e. the RF pulse) as the transmission elements and consequently, the reflection point of the stubs provides a clear, unambiguous marker to identify the corresponding start point of an RF pulse transmitted along the transmission elements.

Thus, according to a further aspect, the present invention may further provide a calibration system including:
 one or more transmission stubs attached to said mounting assembly substantially parallel to said transmission elements, each stub capable of being selectively activated to transmit an RF pulse;
 each stub having two distal ends, a first stub end positioned in lateral alignment with a first end of a said transmission element and the second stub end being positioned in lateral alignment with the interface between the mounting assembly and the active portion of that transmission element.

As used herein, a stub denotes a conductive element with a conduction axis of reduced length compared to said transmission elements used in the transmission array.

Preferably, said transmission stubs are formed from a material with a substantially corresponding electrical conductivity and permittivity to said transmission elements.

Said controller preferably activates the stubs, though in an alternative embodiment separate individual controllers may be used for the stubs and the transmission elements.

In conjunction with the above-described aspects, it can be seen the present invention provides several germane improvements over the prior art, notably the ability to rapidly perform highly accurate non-invasive TDR measurements, with improved calibration accuracy, without recourse to moving transmission elements between readings.

BRIEF DESCRIPTION OF DRAWINGS

Further aspects and advantages of the present invention will become apparent from the following description which is given by way of example only and with reference to the accompanying drawings in which:

FIG. 3 shows an amplitude/time representation for a RF pulse used in conjunction with a prior art calibration method;

FIG. 4 shows an amplitude/time representation for a RF pulse used in conjunction with calibration method according to a further aspect of the present invention;

BEST MODES FOR CARRYING OUT THE INVENTION

Figure 1:
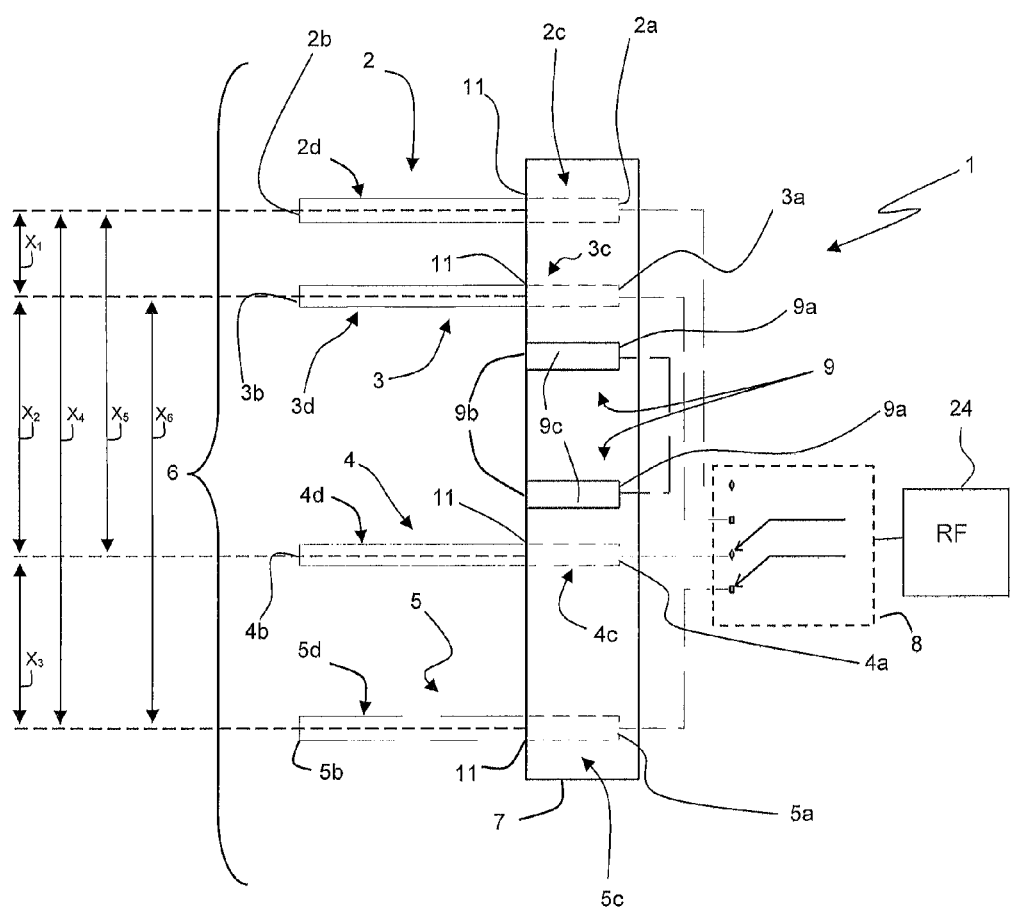
FIG. 1 shows schematic component representation of a preferred embodiment of the present invention in the form of a TDR moisture measurement system.

FIG. 1 shows a schematic representation of the present invention in the form of a non-invasive TDR transmission line system (1) (and associated method of operation) for measuring parameters of an electromagnetic RF pulse (not shown) transmitted along a transmission line composed of four elongated transmission elements provided in the form of four rods (2, 3, 4, 5), each mounted at a first end (2a, 3a, 4a, 5a) to a mounting assembly (7) to form a spatially separated transmission rod element array (6).

The rods (2-5) are thus essentially divided into two portions, a terminal 'head' portion (2c, 3c, 4c, 5c) embedded in the mounting assembly (7) and provided with an individual electrical connection to an RF pulse source (24), and a free distal portion (2d, 3d, 4d, 5d) protruding from the mounting assembly (7) and constituting the 'active portion' of the element (2-5) as hereinbefore defined.

A transition point (11) is formed at the interface between the head (2c-5c) and active (2d-5d) portions of the transmission rods (2-5) where the rod (2-5) exits the mounting assembly (7).

The rods (2-5) are capable of being independently activated by a controller (8) to transmit an RF pulse which is generated by an RF pulse source (24) which is connected to the rods (2-5) via the controller (8). The specific embodiment of the invention described with reference to the drawings utilises the simultaneous activation of pairs of rods (2-5). However, it will be readily apparent that alternative configurations may be utilised including three or more transmission elements, involving the activation of two of the elements simultaneously. This example is thus exemplary only and is not to be construed as limiting.

The controller (8) is capable of selectively activating a pair of transmission rods (2-5) and may be an electrical, physical and/or computer software switching system. The controller (8) is also capable of selectively activating a pair of calibration stubs (9) whose role is more fully described below.

The preferred embodiment of the TDR system (1) described herein is primarily intended to determine moisture content of two or more target materials using the well-established method of measuring the influence on the propagation velocity of the RF pulse caused by the relative electrical permittivity, $\in$ of the target materials and thereby enabling the deduction of the target materials moisture content.

Figure 2:
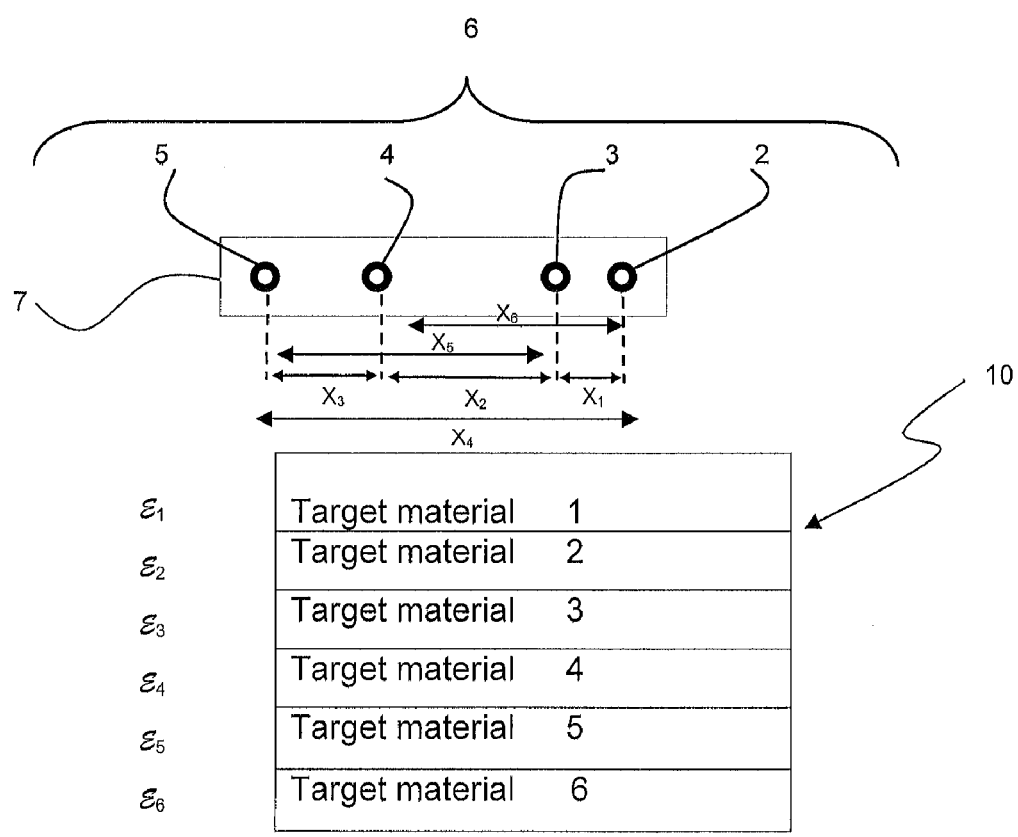
FIG. 2 shows the spatial geometry of a sample material composed of multiple target materials in which moisture content is being measured and the transmission line array of the present invention.

To generate the required number of inputs to solve the simultaneous equations generated by multiple target materials, different geometric configurations of the imposed electric field are created. Previously in the prior art, this required precise movement to alter the transmission rod array (6) separation from the target material. The present invention dispenses with this potential source of inaccuracy and time consumption by enabling the sequential activation of pairs of rods (2-5) with different mutual separations, As shown in FIG. 1 and FIG. 2, the rods (2-5) are mutually parallel, elongated rods, each separated by a unique lateral separation $x_1$-$x_6$. Thus, the four rods (2-5) located at a fixed separation from the target materials (10) provide a maximum of six unique separations $x_1$-$x_6$ between a pair of the selected rods (2-5), generating a corresponding number of different imposed electric fields. This enables rapid measurements to be performed without any physical movement of the transmission array (6).

FIG. 2 shows a stratified model for multiple target materials (10) used for calibration purposes and to illustrate the mathematical analysis associated with determining moisture content of the multiple target materials. The electric field emanating from an activated pair of transmission rods (2-5) causes a polarization field within the dielectric component of each stratum and this in turn effects the pulse propagation time. Measurement of the propagation time (as described more fully below) is used to construct an equation of the electric field resulting from the transmission line and sample interaction[1].

Assuming each target material (10) is a parallel plane strata, and each stratum has a constant electrical permittivity $\in_n$ then the permittivity, $\in_n$, may be directly related to the volumetric moisture content, $\theta_v$, via a simple transform of the type $\theta_v = f(\in)$. Each unique pattern of the electric field emanating from the transmission lines results in one matrix equation. If there are n stratum, (or number of samples), each with a constant permittivity $\in_n$, then n independent matrix equations are required to uniquely specify the permittivity $\in_n$ within each stratum (or sample), The n independent equations are obtained by n different geometric arrangements of the electric field emanating from the transmission rod array (6). Specifically the solution to the new stratified model may be given by:

$$E_{pk} = -G_k \cdot (L+\in)^{-1} \cdot E_{ik} \quad (1)$$

See references 1 and 2

Where $E_{pk}$ is the electric polarization field between the transmission lines, obtained from the measured propagation time and k=1 ... N where n is the number of strata.

G is the polarization gradient between each point in the sample to each point between the transmission elements (2-5).

L is the polarization gradient between each of the points within the sample $\in$ is the required permittivity for each stratum, and $E_{ik}$ is the electric field emanating from the transmission elements (2-5), It can be seen from FIG. 2 that for a sample with six target material stratum (i.e. n=6) that have a lateral spacing of 25 mm between rods (2, 3), and 75 mm between rods (3, 4) and 50 mm between rods (4, 5) can provide the six necessary unique static electric field geometries as shown in table 1 below:

TABLE 1

| Switch Position | Rod Combination | Rod Separation |
|---|---|---|
| 1 | 2 & 3 | $x_1$ = 25 mm |
| 2 | 3 & 4 | $x_2$ = 75 mm |
| 3 | 4 & 5 | $x_3$ = 50 mm |

TABLE 1-continued

| Switch Position | Rod Combination | Rod Separation |
|---|---|---|
| 4 | 2 & 5 | $x_4$ = 125 mm |
| 5 | 2 & 4 | $x_5$ = 150 mm |
| 6 | 3 & 5 | $x_6$ = 100 mm |

Although several parameters of an RF pulse may be used in the determination of the target material permittivity $\in$ (and thereby the target moisture content), typical systems measure the signal amplitude against time.

To perform the measurements of the permittivity $\in_n$ of n materials, (shown as 6 materials in FIG. 2), the TDR system (1) performs the steps including:

a) activating a first pair of transmission rods (2, 3), separated by distance $x_1$, to transmit a first RF pulse;

b) measuring at least one pair of said first RF pulse parameters, e.g. amplitude of the pulse and the time between head—active portion interface (11) and a corresponding second end (2b, 3b);

c) activating a second distinct pair of transmission rods (3, 4), separated by distance $x_2$, to transmit a second RF pulse;

d) measuring the amplitude and pulse propagation time between the interface (11) and second ends (3b, 4b);

e) activating a third distinct pair of transmission rods (4, 5), separated by distance $x_3$, to transmit a third RF pulse;

f) measuring the amplitude and pulse propagation time between the interface (11) and second ends (4b, 5b);

g) activating a fourth pair of transmission rods (2, 5), separated by distance $x_4$, to transmit a fourth RF pulse;

h) measuring the amplitude and pulse propagation time between the interface (11) and second ends (2b, 5b);

i) activating a fifth pair of transmission rods (2, 4), separated by distance $x_5$, to transmit a fifth RF pulse;

j) measuring the amplitude and pulse propagation time between the interface (11) and second ends (2b, 4b);

k) activating a sixth pair of transmission rods (3, 5), separated by distance $x_6$, to transmit a sixth RF pulse;

l) measuring the amplitude and pulse propagation time between the interface (11) and second ends (3b, 5b);

m) using the six pairs of measurements to calculate the electrical permittivity, $\in_1$ to $\in_6$ of the six target materials.

To accurately determine the precise propagation time of the pulse within the active portion of each transmission rod (2-5) it is necessary to be able to unambiguously and repeatedly determine the transition point (11) at which the RF pulse enters the active portion (2d-5d) of the rod (2-5) (i.e. the 'start instance') and the reflection point where the pulse is reflected from the second end (2b-5b) (i.e. the 'stop instance'). The pulse amplitude at both instances exhibits characteristic minima, which aids identification. However, for a variety of complex reasons, the absolute minima do not accurately denote the desired start/stop instances and thus alternative measurement techniques are required.

Prior art methods (shown in FIG. 3) determine the pulse reflection (or "stop") point (17) using the intersection (12) between a horizontal tangent (13) (i.e. a line with a constant amplitude value matching the minima (15)) to the minimum signal amplitude of the reflection point (15) and a line aligned with the steepest gradient (14) adjacent this minima. The same process is used to determine the start point (not shown) and the time period between the start (not shown) and stop (17) points is defined as the propagation time used to determine the permittivity of the material (10).

It has been found however that to achieve the desired calibration tolerance (to within 1 picosecond), such prior art calibration is insufficiently accurate. Thus, according to a further aspect of the present invention, an alternative calibration technique is employed as illustrated in FIG. 4.

In contrast to the above-described prior art method where both the start (18) and stop (17) instances are individually determined from intersection of the steepest adjacent gradient and the respective amplitude minima, the present invention translates (to 14') the steepest gradient (14) from the reflection ("stop") point (17) to the steepest gradient adjacent the start point (18), or vice versa. Thus, both the start (18) and stop (17) points utilise the same gradient (14, 14') to determine intersections (12a, 12b respectively) with a corresponding horizontal tangent (13a, 13b) to the minima (15, 16) signal amplitude. In FIG. 4, it can be seen that the steepest gradient (14) adjacent the reflection (stop) point minima (15) is translated (to 14') to the start point minima (16) to calculate a new intersection (12b) with the minimum time value extrapolation (13). The propagation time (19) is then measured as the time between the start (18) and stop (17) points.

Figure 5:
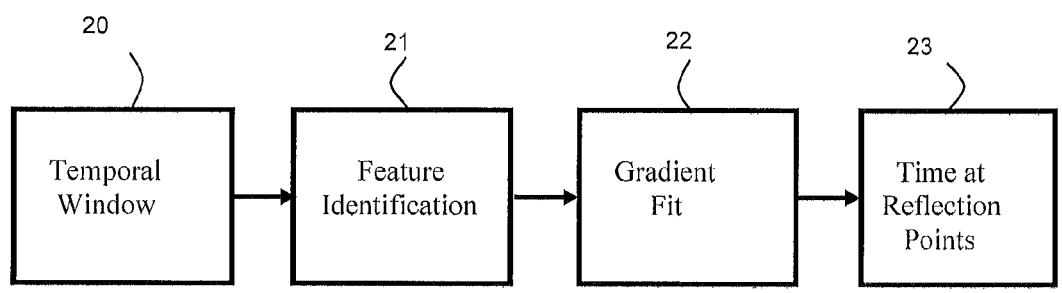
FIG. 5 shows a schematic flow chart of the process to determine the RF pulse propagation time between the transmission line beginning and end points.

The amplitude/time plot of the RF pulse may exhibit several amplitude fluctuations and thus it is necessary to unambiguously identify which minima corresponds to the start (18) and stop (17) points. This is achieved in the preferred embodiment of the present invention by an identification and temporal positioning algorithm described more fully below with respect to FIG. 5.

In one embodiment, positioning of a temporal window for assisting in identification of the start point (18) of the signal in the active portion (2d-5d) of a transmission rod (2-5) is aided by calibration hardware such as calibration stubs (9) shown in FIG. 1. A temporal window limits the search region for the start (18) point.

Two calibration rod stubs (9) have a first terminal head portion (9c) embedded in the mounting head assembly (7) with a first end (9a) connected to the same RF pulse source (24) as the transmission rods (2-5) and are operated by the controller (8). The stubs (9) are orientated such that their second ends (9b) are located at the same lateral points as the interfaces (11) between the heads (2c-5c) of the rods (2-5) and the respective active portions (2d-5d). The stubs (9) are made of the same material as the rods (2-5) and extend for the same length within the mounting head (7) as the rods (2-5). Consequently, an RF pulse transmitted down the stubs (9) provides a well-defined end reflection marker at the same position as the transition (11) to the active portions (2d-5d) of the rods (2-5).

Thus, instances of the characteristic pulse signal reflection in the stubs (9) provides a high confidence time-span in which to locate the first temporal window in the corresponding transmission rod (2-5) signal measurements. The stubs (9) are activated by the controller (8) either manually or by software at defined time is intervals between the transmission rod (2-5) measurements.

The identification and temporal positioning algorithm is part of the calculation process (represented schematically by the flow diagram in FIG. 5) to determine the time at designated start (18) and stop (17) reference points and thus the transit or propagation time (19) of the pulse therebetween. Initially, a temporal window (20) is determined by the system parameters including: the pulse window length, rod length and the like. In the case of the start point (18), these parameters also include the time input from the calibration stubs (9), The temporal window (20) limits the search region for the start (18) and stop (17) points in which a feature extraction process (21) seeks a corresponding unambiguous minima (15 or 16) together with its adjacent curve of the correct shape. After identification of the minima (15 or 16) to a specified confidence, the steepest gradient (14) is calculated (22) and this gradient (14) is translated to intersect the point of steepest gradient adjacent the other minima (16 or 15). The translated gradient is referenced as 14'. The intersections (12a, 12b) of the gradient (14, 14') with a respective line (13a, 13b) extrapolated from each minima (15, 16) at a constant amplitude value for the corresponding minima (15 or 16) are then determined. The points (17, 18) in time in which these intersections (12a, 12b) correlate to are defined as the stop (17) and start (18) points respectively.

The calculated time (23) between the intersection points (12a, 12b) provides the total propagation time (19) of the pulse exposed to the target material.

The total propagation time (19) can thus be compared against reference values of propagation times for materials of known permittivity (and hence moisture content) to determine the moisture content of the material adjacent to the transmission element array (6). Switching between pairs of rods (2-5) of different separation allows the moisture content of different layers of the material to be determined.

Figure 6:
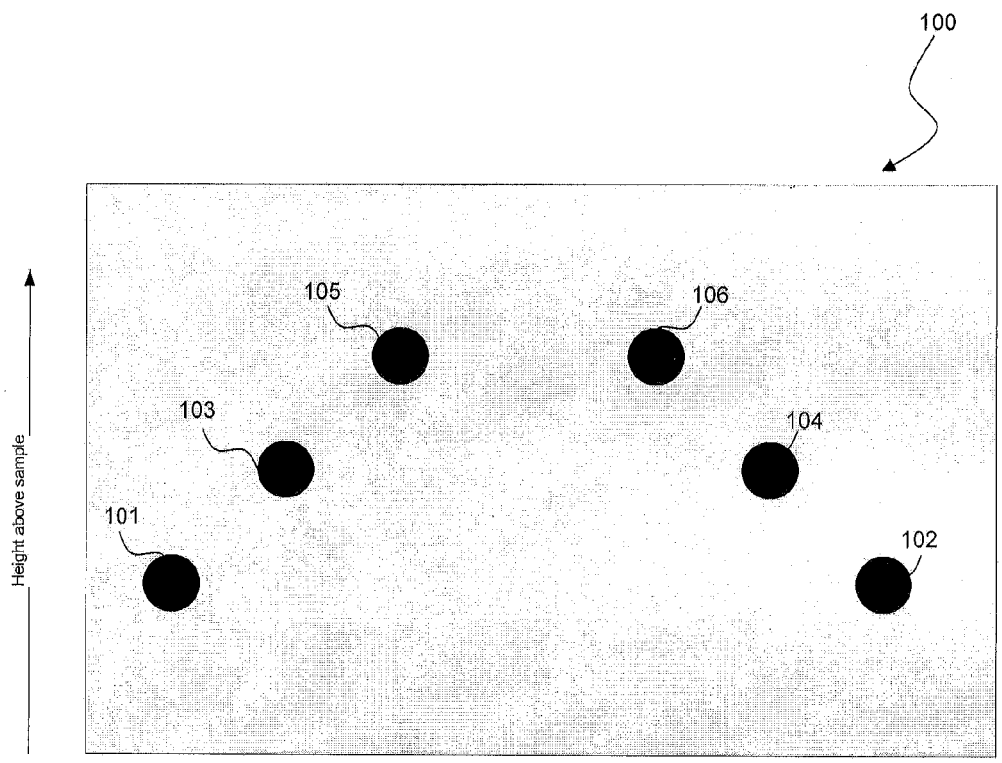
FIG. 6 shows a schematic diagram of an alternative transmission line system.

FIG. 6, shows one alternative embodiment of the present invention in the form of a non-invasive TDR transmission line system (100). The transmission line system (100) is generally similar to the system (1) shown in FIG. 1 and includes, in general, the same components. However, the system (100) has six transmission line rods (101-106) forming three pairs (101 & 102, 103 & 104, 105 & 106). Each pair (101 & 102, 103 & 104, 105 & 106) of rods is spaced from each other pair such that each pair lies in a different plane to that of any other pair, i.e. each pair is spaced vertically so each pair lies in a different horizontal and vertical plane, thereby providing two-dimensional spacing between each rod.

There are generally two ways for altering the electric field penetration of the material.

The first method involves providing multiple pairs of transmission lines with different 'horizontal' spacings as shown in FIGS. 1-2.

The second method involves using a single pair of transmission lines and taking measurements at different separations from the material. However, this second method is prone to errors as the measurements taken are highly sensitive to any changes in geometry and thus the accuracy of the measurements will be highly dependant on the accuracy of the measured variation in separation from the is material.

The system (100) uses the same principles of the second method as described above but uses multiple pairs of transmission line rods (101, 106) with fixed vertical spacings.

The system (100) may thus provide an alternative means to the system (1) for measuring the moisture distribution in a material.

Aspects of the present invention have been described by way of example only and it should be appreciated that modifications and additions may be made thereto without departing from the scope of the appended claims.

REFERENCES

1: Woodhead, I. M., G. D. Buchan and D. Kulasiri, "Pseudo-3-D Moment Method for Rapid Calculation of Electric Field Distribution in a Low-Loss Inhomogeneous Dielectric", IEEE Transactions on Antennas and Propagation, vol. 49, No. 8, pp 1117-1122, 2001.

What we claim is:

1. A non-invasive Time Domain Reflectometry (TDR) transmission line system for measuring one or more parameters of an electromagnetic Radio Frequency (RF) pulse transmitted, and reflected, along a transmission line, said parameters including at least one of; amplitude, propagation velocity and/or propagation time between defined predetermined instances, said system including:
   a transmission line structure including three or more elongated transmission elements, each having two distal ends, wherein any of the three or more transmission elements may be selectively activated to transmit said RF pulse;
   a mounting assembly, mounting each said transmission element at a first said distal end to form a spatially-separated transmission element array with the other second distal end of each transmission element being spaced from said mounting assembly;
   an RF source that transmits an RF pulse along said transmission line to activate a selected pair of said transmission elements to generate an electric field between the transmission elements of said pair;
   characterized in that said transmission elements are capable of selective activation in at least two distinct pairs of elements forming different transmission lines, each pair having distinct geometric configurations relative to the at least one other pair, to generate at least two distinct electric field potentials without physical displacement of the transmission line structure.

2. A non-invasive TDR transmission line system as claimed in claim 1, further including a controller, capable of selectively activating a said pair of transmission elements.

3. A non-invasive TDR transmission line system as claimed in claim 2, wherein the transmission element array is configured with at least two non-identical physical separations between pairs of transmission elements.

4. A non-invasive TDR transmission line system as claimed in claim 2, wherein the transmission elements are parallel rods.

5. A non-invasive TDR transmission line system as claimed in claim 2, further including a calibration system including:
   one or more transmission stubs attached to said mounting assembly substantially parallel to said transmission elements, each stub capable of being selectively activated to transmit an RF pulse;
   each stub having two distal ends, a first stub end positioned in lateral alignment with a first end of a said transmission element and the second stub end being positioned in lateral alignment with the interface between the mounting assembly and an active portion of that transmission element.

6. A non-invasive TDR transmission line system as claimed in claim 2, wherein each pair of transmission elements is spaced from another pair such that each pair of transmission elements lie in a different plane to that of another pair.

7. A non-invasive TDR transmission line system as claimed in claim 1, wherein the transmission line structure is configured with at least two non-identical physical separations between pairs of transmission elements.

8. A non-invasive TDR transmission line system as claimed in claim 7, wherein the transmission elements are parallel rods.

9. A non-invasive TDR transmission line system as claimed in claim 7, further including a calibration system including:
   one or more transmission stubs attached to said mounting assembly substantially parallel to said transmission elements, each stub capable of being selectively activated to transmit an RF pulse;
   each stub having two distal ends, a first stub end positioned in lateral alignment with a first end of a said transmission element and the second stub end being positioned in lateral alignment with the interface between the mounting assembly and an active portion of that transmission element.

10. A non-invasive TDR transmission line system as claimed in claim 1, wherein the transmission elements are parallel rods.

11. A non-invasive TDR transmission line system as claimed in claim 10, where the separation of the parallel rods is variable.

12. A non-invasive TDR transmission line system as claimed in claim 1, further including a calibration system including:
one or more transmission stubs attached to said mounting assembly substantially parallel to said transmission elements, each stub capable of being selectively activated to transmit an RF pulse;
each stub having two distal ends, a first stub end positioned in lateral alignment with a first end of a said transmission element and the second stub end being positioned in lateral alignment with the interface between the mounting assembly and an active portion of that transmission element.

13. A non-invasive TDR transmission line system as claimed in claim 12, wherein the transmission stubs are formed from a material with a substantially corresponding electrical conductivity and permittivity to the transmission elements.

14. A non-invasive TDR transmission line system as claimed in claim 1, wherein each pair of transmission elements is spaced from another pair such that each pair of transmission elements lie in a different plane to that of another pair.

15. A method of non-invasive measurement of electrical permittivity, $\in_n$ of n target materials by determining one or more parameters of an electromagnetic RF pulse transmitted by a TDR transmission line system spatially displaced from said target material, said parameters including amplitude and at least one of: propagation velocity and/or propagation time between defined predetermined points of the transmission line, said system including:
a transmission line structure, including three or more elongated transmission elements, each having two distal ends, wherein any of the three or more transmission elements may be selectively activated to transmit said RF pulse;
a mounting assembly, mounting each said transmission element at a first said distal end to form a spatially-separated transmission element array with the other second distal end of each transmission element being spaced from said mounting assembly;
an RF source that transmits an RF pulse along said transmission line to activate a selected pair of said transmission elements to generate an electric field between the transmission elements of said pair;
said method characterized by the steps of:
a) activating a first pair of said transmission elements to transmit a first RF pulse;
b) measuring at least one pair of said first RF pulse parameters;
c) activating a second pair of said transmission elements to transmit a second RF pulse;
d) measuring at least one pair of said second RF pulse parameters;
e) activating an $n^{th}$ distinct pair of said transmission elements to transmit an $n^{th}$ RF pulse;
f) measuring at least one pair of said $n^{th}$ RF pulse parameters;
g) repeating steps a)-d) n times for n target materials; and
h) using the n pairs of measurements to calculate the electrical permittivity $\in_1$ to $\in_n$ for n target materials.

16. The method as claimed in claim 15, including the step of determining the parameters of propagation time between defined predetermined points for a signal-amplitude vs. time graphical representation, wherein:
a start and stop point respectively denoting the transmitted pulse's transition from an interface between a head of the transmission element to an active portion of the transmission element and reflection from the transmission element second end are defined by steps including:
i. identifying a first unambiguous amplitude minima proximal the pulse transition from said head to said active portion of the transmission element and a second minima proximal to the pulse reflection from the second end of said transmission element;
ii. determining a first and a second maximum gradient adjacent to each of said first and said second minima respectively;
iii. calculating for each said minima, an intersection point between a first tangent to the first said maximum gradient and a constant amplitude value extrapolation of the corresponding minima;
iv. translating said first tangent to the second maximum gradient;
v. determining intersection points between the translation of said first tangent to the second maximum gradient and a constant amplitude value extrapolation of the corresponding minima;
vi. defining said intersection points as said predetermined start and stop points for calculating the pulse propagation time.

17. The method as claimed in claim 16, wherein said first maximum gradient is the maximum gradient adjacent said second minima.

18. The method of claim 16, wherein substantially identical RF pulses are transmitted along each distinct pair of transmission elements.

19. The method of claim 15, wherein substantially identical RF pulses are transmitted along each distinct pair of transmission elements.

20. A method of non-invasive measurement of electrical permittivity of a target material using a Time Domain Reflectometry (TDR) transmission line system, the method comprising the step of:
determining the propagation time of an electromagnetic RF pulse transmitted along a pair of transmission elements between defined predetermined points of the transmission line using a TDR transmission line system for measuring one or more parameters of an electromagnetic Radio Frequency (RF)pulse transmitted, and reflected, along a transmission line, said parameters including at least one of; amplitude, propagation velocity and/or propagation time between defined predetermined instances, said system including:
a transmission line structure including three or more elongated transmission elements, each having two distal ends, wherein any of the three or more transmission elements may be selectively activated to transmit said RF pulse;
a mounting assembly, mounting each said transmission element at a first said distal end to form a spatially-separated transmission element array with the other second distal end of each transmission element being spaced from said mounting assembly;

an RF source that transmits an RF pulse along said transmission line to activate a selected pair of said transmission elements to generate an electric field between the transmission elements of said pair;

characterized in that said transmission elements are capable of selective activation in at least two distinct pairs of elements forming different transmission lines, each pair having distinct geometric configurations relative to the at least one other pair, to generate at least two distinct electric field potentials without physical displacement of the transmission line structure.

\* \* \* \* \*